(12) United States Patent
Fado et al.

(10) Patent No.: US 6,999,591 B2
(45) Date of Patent: Feb. 14, 2006

(54) AUDIO DEVICE CHARACTERIZATION FOR ACCURATE PREDICTABLE VOLUME CONTROL

(75) Inventors: Francis Fado, Highland Beach, FL (US); Peter J. Guasti, Coral Springs, FL (US); Gary R. Hanson, Palm Beach Gardens, FL (US); Keith P. Loring, Milton, VT (US); Harvey M. Ruback, Loxahatchee, FL (US); Steven G. Woodward, Boca Raton, FL (US)

(73) Assignee: International Business Machines Corporation, Armonk, NY (US)

( * ) Notice: Subject to any disclaimer, the term of this patent is extended or adjusted under 35 U.S.C. 154(b) by 1096 days.

(21) Appl. No.: 09/794,784

(22) Filed: Feb. 27, 2001

(65) Prior Publication Data

US 2002/0159608 A1 Oct. 31, 2002

(51) Int. Cl.
H04R 29/00 (2006.01)

(52) U.S. Cl. .......................................... 381/58; 381/107
(58) Field of Classification Search ................ 381/104, 381/3, 4, 320, 321, 58, 56; 704/231, 246, 704/251, 275
See application file for complete search history.

(56) References Cited

U.S. PATENT DOCUMENTS 6,522,988 B1 * 2/2003 Hou ............................ 702/122
6,574,342 B1 * 6/2003 Davis et al. ................. 381/314

* cited by examiner

Primary Examiner—Brian T. Pendleton
(74) Attorney, Agent, or Firm—Akerman Senterfitt

(57) ABSTRACT

An automatic gain control method in accordance with the inventive arrangements can include the following steps. Initially, an audio signal can be provided to an audio device which has a range of permissible signal level settings and a signal level controller for establishing a particular signal level setting. In addition, an actual signal level can be measured for the audio signal at an established signal level setting. The measured actual signal level further can be stored in a volume map along with the corresponding established signal level setting. Following the storage of the measured actual signal level in the volume map, a different signal level setting can be established using the signal level controller. Subsequently, the actual signal level can be re-measured and the re-measured actual signal level and corresponding established different signal level setting can be stored in the volume map. Finally, the volume map can be used during an audio processing session to determine a signal level setting for the audio device, wherein the signal level setting corresponds to a desired actual audio signal level. In one aspect of the present invention, the method can also include detecting a hysteresis condition in the volume map.

22 Claims, 5 Drawing Sheets

FIG. 1

| Command | Allowed Values | Description |
|---|---|---|
| filename | text string | file for storing volume map |
| directory | text string | directory for storing file containing volume map |
| codec_id | 4 characters | specifies codec associated with volume map |
| mic_id | 4 characters | specifies microphone associated with volume map |
| maxgain | number (0-100) | beginning input level setting |
| mingain | number (0-100) | ending input level setting |
| gainstep | number (1-100) | increment |
| hysteresis | number (0-32767) | hysteresis threshold |

*FIG. 2*

```
typedef struct _VOLUMEMAP
{
    unsigned char mapid;
    unsigned char flags;
    unsigned char codec_id;
    unsigned char mic_id;

int sample_res;
    int numchannels;
    int maxsetting;
    int minsetting;
    int increment;

long numvalues;

int * volumemap;

} VOLUMEMAP;
```

AUDIO DEVICE CHARACTERIZATION FOR ACCURATE PREDICTABLE VOLUME CONTROL

BACKGROUND OF THE INVENTION

1. Technical Field

This invention relates to the field of audio devices, and more particularly, to characterizing audio devices for controlling audio signal levels.

2. Description of the Related Art

Speech recognition is the process by which an acoustic signal received by a transducive element, such as a microphone, is converted to a set of text words, numbers, or symbols by a computer. These recognized words may then be used in a variety of computer software applications for purposes such as document preparation, data entry, and command and control. Improvements to speech recognition systems provide an important way to enhance user productivity.

For accurate conversion of a user spoken utterance to recognized text, the audio signal representing the user spoken utterance should have an adequate signal level. Oftentimes, the speech recognition system can misrecognize user spoken utterances if the audio signal level is too low or too high. One important factor which substantially can affect the level of an audio signal can be the distance between the speaker and the microphone. Typically, during a speech dictation session, the distance between a user and the microphone can be a constantly changing parameter. More particularly, though the microphone initially can be positioned such that the speaker is located in close proximity to the microphone, as the speaker dictates, the speaker can unknowingly shift body positioning, or otherwise can maneuver such that the distance between the speaker and the microphone changes. Accordingly, the level of the audio signal received by the speech recognition system also changes. For example, as the speaker draws closer to the microphone, the audio signal level can increase. Conversely, as the speaker pulls away from the microphone, the distance between the speaker and the microphone increases, which can result in a decreased audio signal level.

To ensure that an optimal audio signal level is received by a speech recognition system, automatic gain controls (AGCs) have been implemented in conventional audio device control software which can cooperate with a speech recognition system in order to monitor incoming audio signal levels. Based upon whether a received audio signal is too weak or too strong, conventional AGCs can dynamically adjust, i.e., raise or lower, the input signal level accordingly. Thus, by incorporating a software-based AGC within a speech dictation system, conventional speech dictation systems can dynamically adjust actual audio signal levels during a speech dictation session, thereby increasing speech recognition accuracy.

Presently, however, conventional speech recognition systems incorporating AGC software are deployed across a variety of computing platforms, which further can contain a variety of audio devices. Generally, audio device characteristics vary from audio device to audio device. For example, though an audio input device, such as a sound card or an audio preamplifier, can have an adjustable input range of input level settings ranging from zero to one-hundred, such audio devices can actually have a more limited resolution of possible input signal levels.

For example, adjusting the input signal level from a setting of zero to a setting of ten may not change the actual audio signal level of an incoming audio signal. However, a change in the input signal level from ten to eleven can result in an increase in the actual audio signal level. Similarly, the actual audio signal level can remain constant for the input level adjustments ranging from eleven to twenty, followed by a sudden step-like increase in the actual audio signal level when the input control level is adjusted from twenty to twenty-one. In this manner, an audio device can have ten ranges where the actual audio signal level transitions can correspond to increments of ten on the input level control. In consequence, actual audio signal levels can be mapped to particular input level settings for a particular audio device.

Notably, an audio device in a different computing platform can have audio signal transitions which map to different input signal levels. For example, a different audio device can have a map which indicates transitions responsive only to five actual adjustments to the input signal level while the actual audio signal level remains constant for the input level range of zero to twenty, twenty-one to forty, and forty-one to sixty. Notably, audio device driver specifications typically omit the actual ranges where an actual audio signal level changes responsive to changes in the input level. Similarly, audio device driver specifications typically do not disclose the magnitude by which an actual audio signal level can change in response to a change from one input level setting to another. Thus, input signal level adjustments performed by an AGC in one computing platform can result in unexpected actual audio signal level changes when applied to a different computing platform.

In view of the cross-platform requirements of modern speech recognition systems, to accommodate multiple, differing computing platforms having different audio devices, an AGC must dynamically adjust input signal levels in small increments until the desired actual audio signal level is reached. More particularly, without knowing the audio characteristics of a particular audio device, the AGC cannot determine when the actual audio level will change in response to an adjustment to the input signal level. Furthermore, when the input signal level changes, the ACG cannot determine the magnitude of a corresponding change in the actual audio signal level until after the change occurs. Thus, if an AGC changes the input signal level too quickly, the ACG may overshoot the desired actual audio signal level. The result can be inaccurate speech recognition.

There can be other disadvantages to the fine adjustment of the input level of an audio signal. Specifically, while an AGC fine adjusts the input signal level, the AGC consumes computer system resources which become unavailable to other application programs, including the speech recognition system. In addition, it can be disadvantageous to incrementally changing the input signal level because during the time period consumed by the incremental adjustments, the actual audio signal level remains improperly adjusted which can cause an increased risk of misrecognition by the speech recognition system. Significantly, present AGC implementations can require between ten and twenty seconds to properly adjust the actual audio signal level.

SUMMARY OF THE INVENTION

The present invention solves the automatic gain controller (AGC) problem of the prior art by characterizing particular audio devices and, subsequently, providing the characterization data to an AGC for use in an audio processing application. Such a characterization, or volume map, permits the AGC to determine what actual changes in audio signal amplitude will occur responsive to an attempt to adjust the input volume. In order to allow cross-platform portability for speech recognition and AGC, the audio device characterization can be provided in tabular form.

An AGC method in accordance with the inventive arrangements can include the following steps. Initially, an audio signal can be provided to an audio device which has a range of permissible signal level settings and a signal level controller for establishing a particular signal level setting. In addition, an actual signal level can be measured for the audio signal at an established signal level setting. The measured actual signal level further can be stored in a volume map along with the corresponding established signal level setting. In one aspect of the present invention, the audio signal can be an audio input signal. Yet, in another aspect of the present invention, the audio signal can be an audio output signal.

Following the storage of the measured actual signal level in the volume map, a different signal level setting can be established using the signal level controller. Subsequently, the actual signal level can be re-measured and the re-measured actual signal level and corresponding established different signal level setting can be stored in the volume map. Finally, the volume map can be used during an audio processing session to determine a signal level setting for the audio device, wherein the signal level setting corresponds to a desired actual audio signal level. In one aspect of the present invention, the method can also include detecting a hysteresis condition in the volume map.

Importantly, the providing step can include the step of providing an audio signal of known frequency and constant signal level to the audio device. Also, the measuring step can include the step of measuring an actual signal level for the audio signal at a first permissible signal level setting in the range and storing the measured actual signal level and corresponding first permissible signal level setting in the volume map. Moreover, the step of establishing a different signal level setting using the signal level controller, re-measuring the actual signal level and storing the re-measured actual signal level and corresponding established different signal level setting in the volume map can include incrementally adjusting upward the signal level setting using the signal level controller, re-measuring the actual signal level and storing the re-measured actual signal level and corresponding incrementally adjusted signal level setting in the volume map. Finally, the steps of measuring and re-measuring the actual signal level can include measuring and re-measuring an average peak amplitude for the audio signal.

The step of using the volume map to determine an optimal signal level setting for the audio device during an audio processing session can include determining established signal level settings in the volume map at which an incremental change occurs in the corresponding actual signal level; and, adjusting the actual audio signal level according to the determined signal level settings. Moreover, the determining step can include computing an average of successive actual signal level values in the volume map; comparing each successive actual signal level value to the computed average; and, if a compared actual signal level value differs from the computed average by more than a pre-determined value, identifying a corresponding established signal level setting as a signal level setting at which an incremental change occurs, and resetting the average. Importantly, in one aspect of the invention, the audio processing session can be a speech recognition session.

An audio device characterization method in accordance with the inventive arrangements can include providing an audio signal to an audio device having a range of permissible signal level settings and a signal level controller for establishing a particular signal level setting; measuring an actual signal level for the audio signal at an established signal level setting and storing the measured actual signal level and corresponding established signal level setting in a table. Subsequently, a different signal level setting can be established using the signal level controller, and the actual signal level, re-measured actual signal level and corresponding established different signal level can be stored in the table. Finally, the step of establishing a different input signal level setting using the input signal level controller, re-measuring the actual signal level and storing the re-measured actual signal level and corresponding input signal level setting in the volume map can be repeated for each permissible input signal level setting.

In one aspect of the present invention, the measuring step can include measuring an actual signal level for the audio signal at a first permissible signal level setting in the range and storing the measured actual signal level and corresponding first permissible signal level setting in the table. Additionally, the step of establishing a different signal level setting using the signal level controller, re-measuring the actual signal level and storing the re-measured actual signal level and corresponding established different signal level setting in the table can include incrementally adjusting upward the signal level setting using the signal level controller, re-measuring the actual signal level and storing the re-measured actual signal level and corresponding incrementally adjusted signal level setting in the table.

Once the table has been completed, successive actual signal level measurements in the table can be compared. Notably, the comparisons can identify threshold changes in actual signal levels responsive to changes in corresponding input signal level settings. For each identified threshold change in actual signal level, the changed actual signal level and corresponding input level setting in a volume map. Importantly, the volume map can be distributed for use with the audio device.

BRIEF DESCRIPTION OF THE DRAWINGS

There are shown in the drawings embodiments which are preferred, it being understood, however, that the invention is not so limited to the precise arrangements and instrumentalities shown, wherein.

DETAILED DESCRIPTION OF THE INVENTION

The invention provides a method and a system for characterizing audio devices. In accordance with the inventive arrangements, the input characteristics of an audio device can be determined such that the resulting characterization data can be made available to automatic gain controller (AGC) software. The characterization data can permit the AGC to determine what actual changes in audio signal level will occur when an attempt to adjust the volume is made.

More particularly, a volume map can be created which can contain therein a table of input signal level settings and corresponding measured signal levels. By inspecting the volume map, an audio processing application can determine what input signal level settings for the audio device correspond to actual changes to the signal level to more accurately and efficiently adjust the signal level of an audio signal. In one embodiment of the present invention, an AGC system can include a target computing device which can contain the audio device to be characterized and suitable computing structure to host a program for generating a volume map in accordance with the inventive arrangements. Furthermore, the system can include an audio signal source for providing an audio signal to the target computing device.

Figure 1:
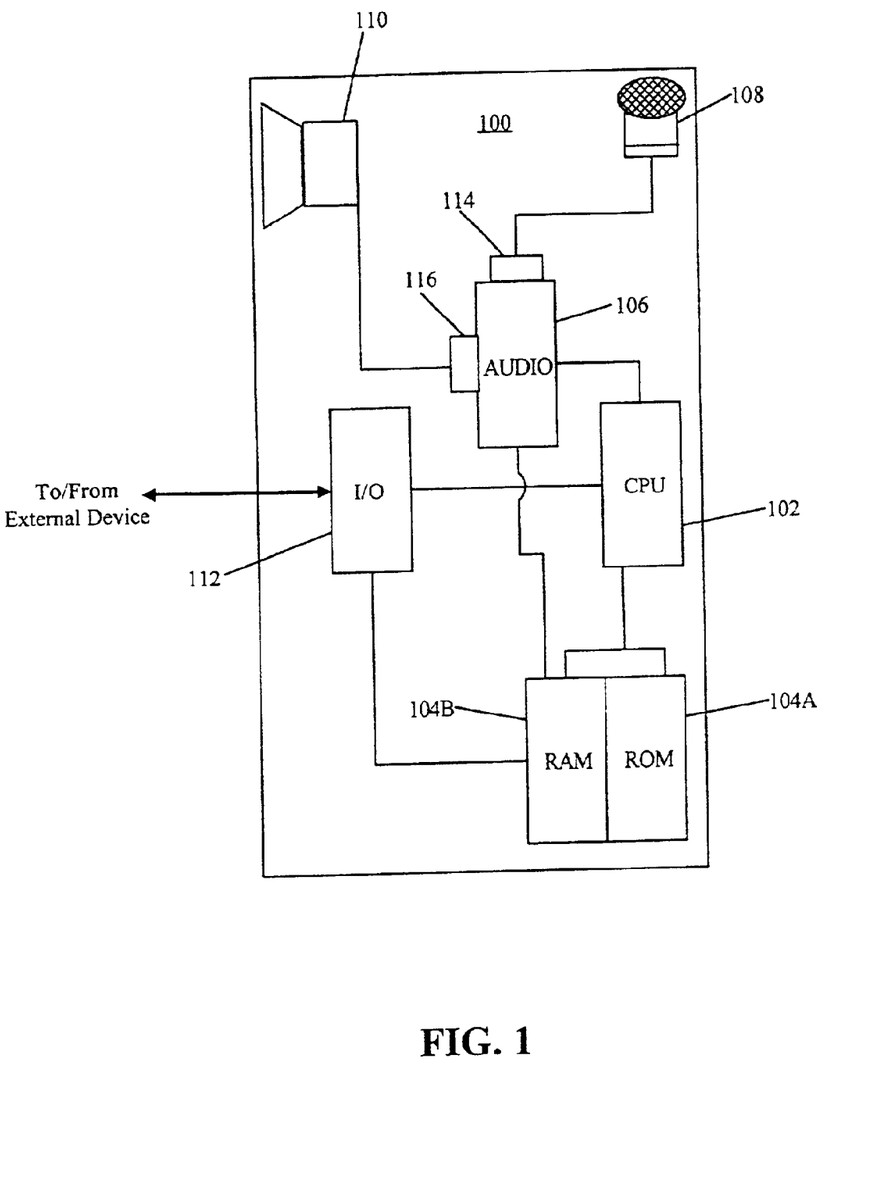
FIG. 1 is a schematic illustration of a target computing device suitable for use with the automatic gain control map generation method of the present invention.

FIG. 1 is a schematic illustration of an exemplary target computing device configured for performing an automatic gain controller method in accordance with the inventive arrangements. A target computing device 100 configured in accordance with the inventive arrangements can include a central processing unit (CPU) 102, one or more memory devices and associated circuitry 104A, 104B, and an audio device 106. The CPU can be comprised of any suitable microprocessor or other electronic processing unit, as is well known to those skilled in the art. Memory devices can include both non-volatile memory 104A and volatile memory 104B. Examples of non-volatile memory can include read-only memory and flash memory. Examples of non-volatile memory can include random access memory (RAM).

The audio device 106 can be a conventional audio subsystem for converting both analog audio input signals to digital audio data, and also digital audio data to analog audio output signals. The audio device 106 can include an audio input port 114 and an audio output port 116. The audio input port 114 can receive an audio input signal provided by an audio input device such as a microphone 108. Similarly, the audio output port 116 can transmit an audio output signal to an audio output device such as a speaker 110. Optionally, the target computing device 100 can be remotely controlled over a communications link provided through I/O controller 112. As is the case in conventional embedded systems, a remote computing platform can provide instructions to the CPU 102 through I/O controller 112 where the I/O controller 112 is a serial port, network interface, or other suitable communications interface.

In operation, a process for characterizing the audio device 100 can include the following steps. First, a program configured to perform an audio characterization method in accordance with the inventive arrangements can be loaded into memory 104B and executed by the CPU 102. Second, an audio signal can be provided as audio input to the target computing device 100 through the audio input port 114 to the audio device 116. The audio signal provided to the audio device 116 can be of known frequency and constant signal level. Third, starting at either the highest or lowest value of a permissible range of input level values (for example, 0–100), the input volume of the audio device 116 can be incrementally adjusted by the audio characterization program.

In one aspect of the invention, at each incremental adjustment, the audio characterization program can measure the average peak amplitude of the signal and store the measured value in a table. Subsequently, the audio characterization program can analyze the table to determine the increments at which actual volume changes in the audio signal occur. Actual volume changes are referred to hereinafter as "steps". Each step represents an established input level setting responsive to which an actual change in volume occurs.

To identify each step for a particular audio device, the audio characterization program can begin at either endpoint of the table and can compare the next value in the table to the current average. If the next value deviates significantly from the average it constitutes a step and a new average is started. Otherwise, the value is considered not to be a step and is factored into the current average. Finally, once the steps have been identified, a table can be created, referred to hereinafter as a "volume map", in which the steps can be stored.

Subsequently, the volume map can be provided to an audio processing program incorporating an AGC. An exemplary audio processing program can include a speech recognition system. Importantly, however, the volume map can be used in applications other than speech recognition. Moreover, the present invention is not limited strictly to receiving an audio signal through the audio input port 114. Rather, the present invention can be incorporated in an AGC for use with the audio output port 116. More particularly, audio players, such as those audio devices that provide audio through speakers or headphones, also can use a volume map to programmatically adjust output volume in a predictable, deterministic fashion.

In order to create a volume map, the audio characterization program can be executed in the target computing device. In one embodiment of the present invention, the audio characterization program can be executing using a definition file for particularly defining the execution of the audio characterization program for the particular audio device. In this embodiment of the present invention, the definition file can include various parameters, specified in the table 200 of FIG. 2.

Figure 2:
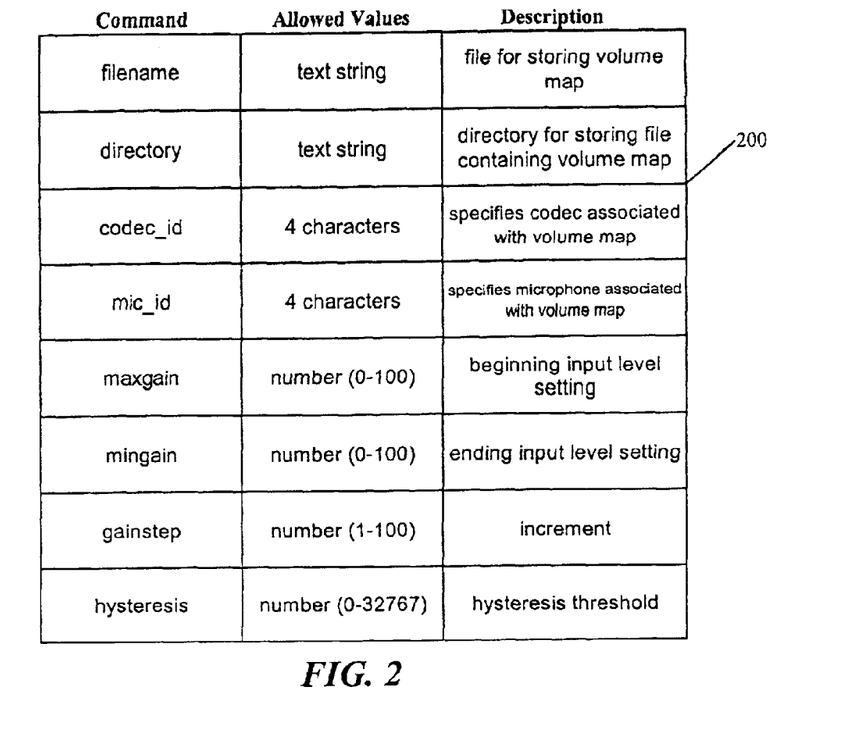
FIG. 2 is a table describing specified scripting commands for use in a definition file useful for configuring an automatic gain control map generation system.

As shown in FIG. 2, such parameters can include a filename, directory, codec_id, mic_id, maxgain, mingain, gainstep and hysteresis. The filename parameter is a text string which specifies the name of the file into which the volume map can be stored. The directory is a text string which specifies the directory where the volume map can be stored. The codec_id specifies the particular codec of the audio device associated with the volume map. The mic_id optionally specifies a particular microphone associated with the volume map. The maxgain is a number which specifies the beginning input level setting. Conversely, the mingain is a number which specifies the ending input level setting. The gainstep parameter specifies the input level setting increment.

Finally, the hysteresis parameter specifies the threshold for determining a hysteresis condition in the volume map.

Hysteresis occurs in audio devices whose step values or volume ranges depend upon whether the volume is increasing or decreasing. More particularly, the hysteresis parameter can be used in the comparison of the upward and downward measured levels at each input level setting in the table. If the absolute difference exceeds the hysteresis parameter for any of the measurements, a hysteresis condition can be declared and the volume map can include input level setting and signal measurement data from both downward and upward passes. Otherwise the volume map need include only the initial downward pass.

Figure 3:
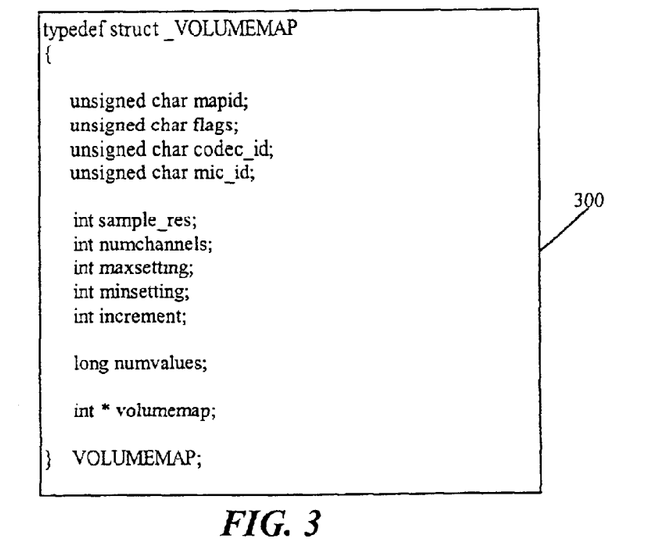
FIG. 3 is an exemplary data structure for storing an automatic gain control map to generated in accordance with the inventive method.

Once a volume map has been created, the volume map can be stored in a data structure, for instance the exemplary data structure illustrated in FIG. 3. As shown in FIG. 3, a volume map data structure configured in accordance with the inventive arrangements can include two components: a header which identifies the volume map structure, the nature of the volume map data and the conditions under which the is volume map was created; and, the volume map, itself. As shown in FIG. 3, a volume map structure can include the following data members: mapid, flags, codec_id, mic_id, sample_res, numchannels, maxsetting, minsetting, increment, numvalues and volumemap.

The mapid member can identify the volume map and the version of the audio characterization program used to create the volume map. The flags member can be a bit field for describing the nature of the audio characterization data. In one aspect of the invention, the flags data member can include the following data:

Endianess—Whether the data is little-endien or big-endien.

Signed—Whether the sample values are signed or unsigned.

Bi-directionality—Whether the map has identified a hysteresis condition.

Warning—Whether a warning occurred during analysis.

Error—Whether an error occurred during analysis.

The value represented by the codec_id field can be specified by the user of the audio characterization software to aid in identifying the audio device for which the volume map was created. Similarly, the mic_id value can be specified by the user of the audio characterization software to aid in identifying the microphone for which the volume map was created. Audio processing applications can read these values to ensure use of the correct volume map.

The sample_res data member can specify the number of bits per sample used to represent the analyzed audio signal. Similarly, the numchannels data member can specify the number of channels (mono or stereo) used to represent the analyzed audio signal. The maxsetting data member can specify the maximum input level setting while the minsetting parameter can specify the minimum input level setting. The increment parameter can specify the input level setting increment used throughout the audio characterization process. More particularly, the increment data member represents the amount the input level setting has changed as the audio characterization program iterates through the permissible range of input level settings from minsetting to maxsetting, or vice versa.

The numvalues parameter can indicate the number of values contained in the volume map. Notably, if a target audio device exhibits hysteresis, then the volume map can consist of two sets of values, one each for the analysis obtained when iterating from minsetting to maxsetting, and then another when iterating from maxsetting to minsetting. Otherwise, the volume map can contain only one set of values for either maxsetting to minsetting, or minsetting to maxsetting. Finally, volumemap can be a pointer to an integer array of the length specified in numvalues. The integer array can contain the actual volume map data. Notably, an exemplary volume map exhibiting hysteresis behavior is listed in Appendix A and an exemplary volume map data structure is listed in Appendix B.

Figure 4A:
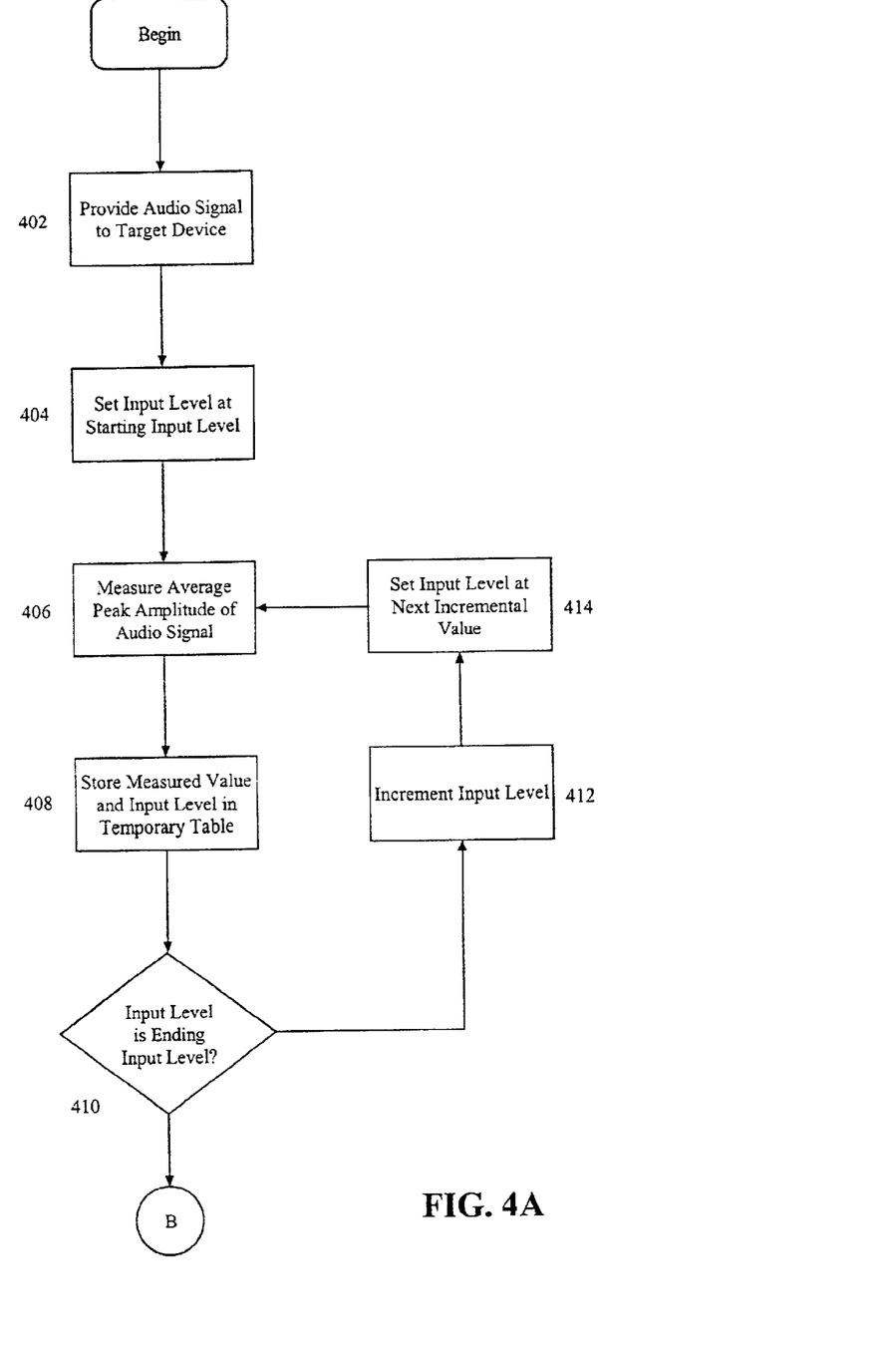
FIG. 4A-4B, taken together, is a flow chart illustrating a process for generating an automatic gain control map in accordance with the inventive arrangements.
Figure 4B:
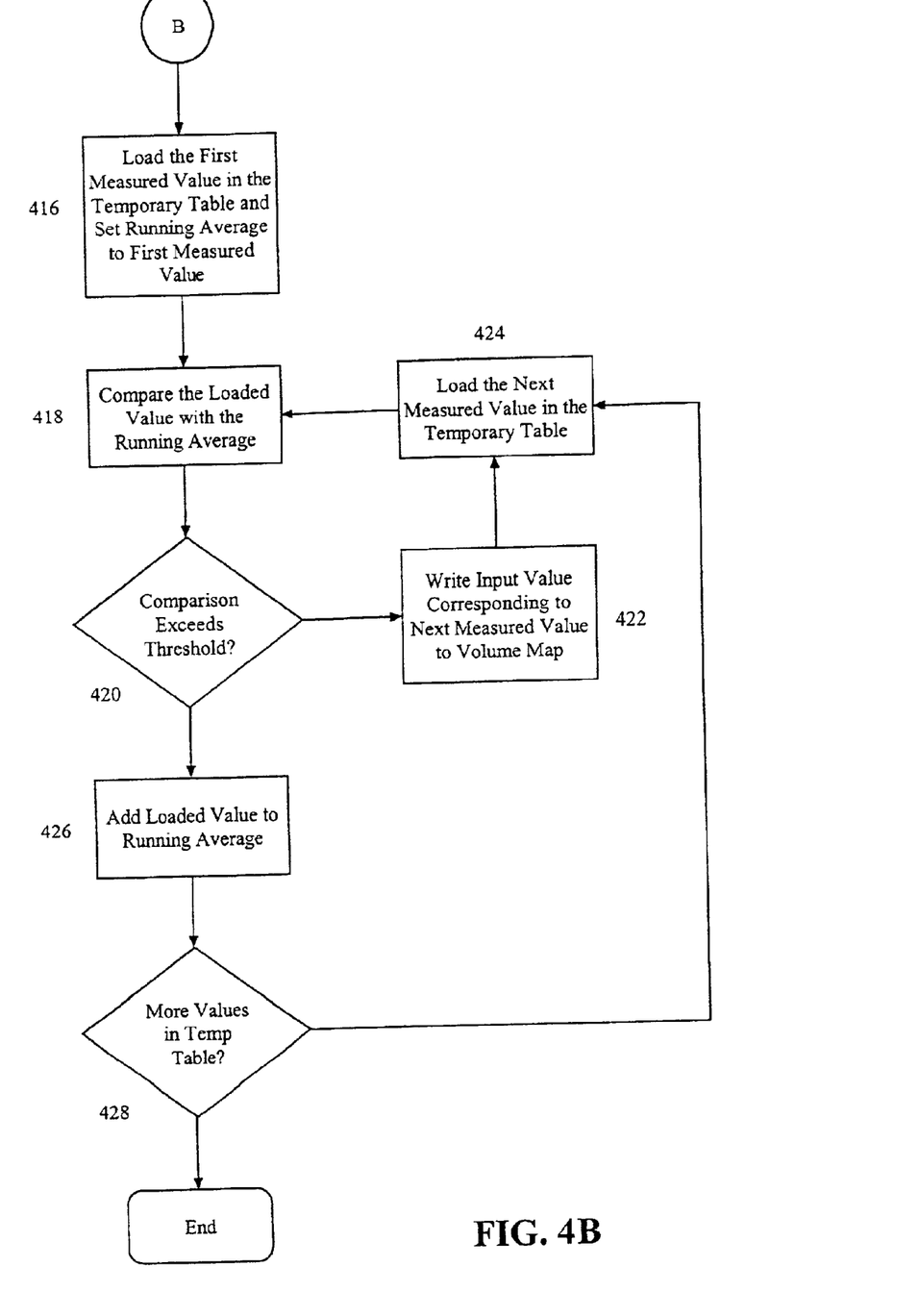

FIGS. 4A and 4B, taken together, illustrate a process for creating a volume map for use in an audio processing system. Beginning in step 402 of FIG. 4A, an audio signal can be provided to a target computing device having therein an audio device. In step 404, a starting input level can be established in the audio device. In step 406, the average peak amplitude of the audio signal can be measured, and in step 408, both the measured average peak amplitude and the established input level can be stored in a temporary table. In decision step 410, if the established input level is not the last input level in the range of permissible input levels, then in steps 412 and 414, the input level can be incrementally increased by a pre-determined increment. Subsequently, the process can repeat until in decision step 410 no input levels remain in the range of permissible input levels.

When no input levels remain in the range of permissible input levels, continuing through jump circle B of FIG. 4B, the measured values stored in the temporary table can be processed to determine those input values responsive to which changes occur in the measured values. Specifically, in step 416, the first measured value in the temporary table can be loaded and a running average can be set to the first measured value. In step 418, the loaded value can be compared to the running average. In step 420, if the difference between the loaded value and the running average exceeds a threshold value, a step will have been identified and, in step 422, the input value which corresponds to the loaded value can be written to the volume map. Subsequently, in step 424 the next measured value in the temporary table can be loaded and the process can repeat.

By comparison, in step 420, if the difference between the loaded value and the running average does not exceed a threshold value, a step will not have been identified and, in step 426 the loaded value can be averaged into the running average. Subsequently, in step 428, if more measured values remain in the temporary table, in step 424 the next measured value in the temporary table can be loaded and the process can repeat until no more measured values remain in the temporary table. At that point, the process can end and the volume map will have been considered complete.

Figure 5A:
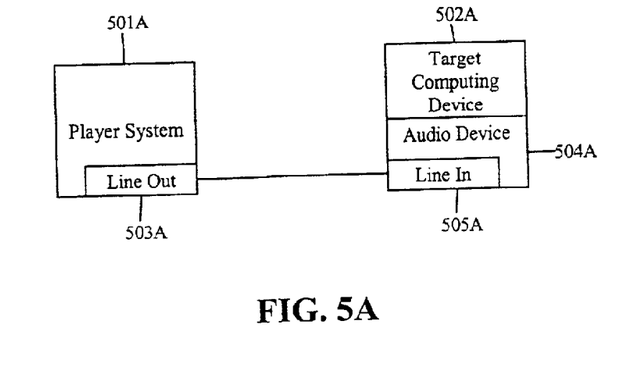
FIG. 5A is a block diagram illustrating an exemplary computer system configuration for performing an automatic gain controller method in accordance with the inventive arrangements.
Figure 5B:
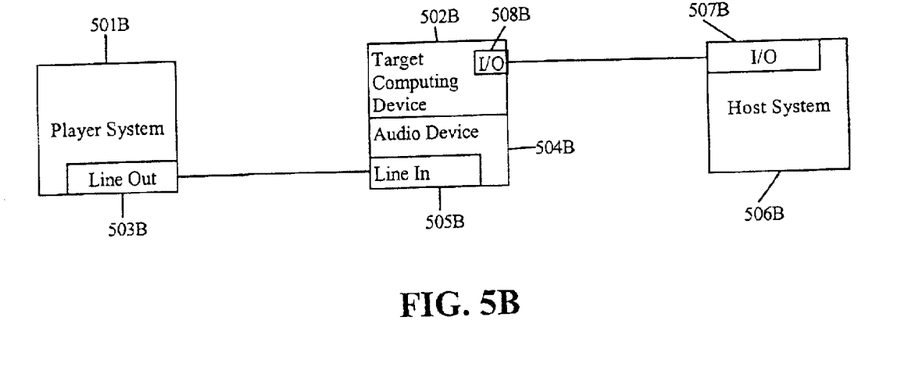
FIG. 5B is a block diagram illustrating another exemplary computer system configuration for performing an automatic gain controller method in accordance with the inventive arrangements.
Figure 5C:
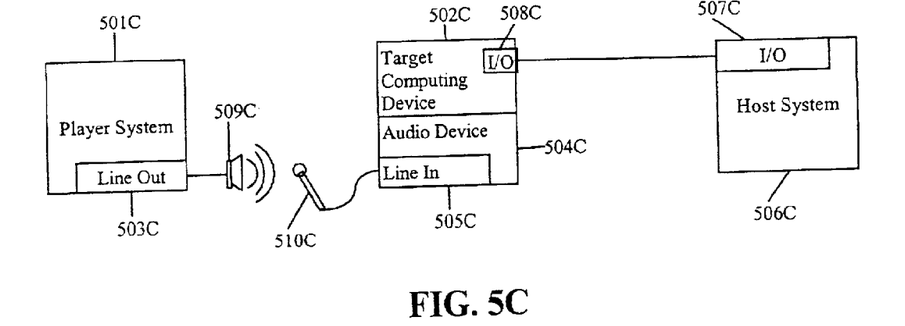
FIG. 5C is a block diagram illustrating yet another exemplary computer system configuration for performing an automatic gain controller method in accordance with the inventive arrangements.

In order to generate the volume map, an audio device characterization program can be installed within a target computing device such as that which is illustrated in FIG. 1, that allows the target computing device to receive audio data from an audio device whose input volume it can control. Several system configurations which incorporate the target computing device can suffice. FIGS. 5A through 5C illustrate three such examples.

In FIG. 5A, the system can include a target computing device 502A containing the audio device 504A under study. The audio characterization program can execute in the target computing device 502A. A separate audio playback system 501A can contain a signal generator, typically an audio card. The signal generator output port 503A can be connected to the audio input port 505A of the audio device 504A under study. Notably, The separate audio playback system 501A can be configured to generate a constant, single-frequency tone having a prescribed amplitude.

In operation, when the audio characterization program executes, the audio device 504A can begin to read the audio data, all the while adjusting the input level, analyzing the resulting audio data, and generating the volume map. In the configuration illustrated in FIG. 5A, the target computing device 502A can provide the necessary console I/O so that the audio characterization program can be controlled. Moreover, the target computing device 502A can provide the necessary file I/O so that the audio characterization program can store the volume map to fixed storage.

FIG. 5B illustrates an alternative system configuration. In FIG. 5B, the remote audio playback system 501 B operates as in the system of FIG. 5A. Also, as in FIG. 5A, the audio characterization program executes in the target computing device 502B. However, the target computing device 502B of FIG. 5B does not provide console I/O or file I/O as in FIG. 5A. Rather, in the system of FIG. 5B, the console I/O and the file I/O can be provided remotely by a host system 506B which can be communicatively linked to the target computing device 502B. In the system of FIG. 5A, both the host system 506B and the target computing device 502B can use a common communications protocol 507B, 508B to re-direct I/O between the host system 506B and the audio device characterization program. Except for this difference, however, the audio device characterization program operates identically as in the system of FIG. 5A.

Finally, in FIG. 5C, yet another system configuration is illustrated. Specifically, the system illustrated in FIG. 5C is similar to the system of FIG. 5B except that the remote audio playback system 501 C can provide audio input to the audio device 505C under study not through a direct communications link, but through an audio input device communicatively linked to the audio input port 505C of the audio device 504C. More ark particularly, the audio playback system 501 C can provide analog audio signals through a speaker 503C to a microphone 510C connected to the audio input port 505C of the audio device 504C. Except for this change, all components operate as described in FIG. 5B.

To provide the functionality depicted in FIGS. 5B and 5C, the audio device characterization program can include a replaceable communications abstraction layer referred to as a Field Replaceable Transport layer, or FRT layer. FRTs using various communications protocols can be inserted into the audio device characterization program, allowing the program to operate on target computing devices incorporating different communications facilities. The FRT provides an abstracted API that remains consistent across all target computing devices. In this case, only the implementation underlying the API need change along with changing target computing devices.

The present invention can be realized in hardware, software, or a combination of hardware and software. A method and system for completing user input in a SRS according to the present invention can be realized in a centralized fashion in one computer system, or in a distributed fashion where different elements are spread across several interconnected computer systems. Any kind of computer system—or other apparatus adapted for carrying out the methods described herein—is suited. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which when loaded in a computer system is able to carry out these methods.

Computer program means or computer program in the present context means any expression, in any language, code or notation, of a set of instructions intended to cause a system having an information processing capability to perform a particular function either directly or after either or both of the following a) conversion to another language, code or notation; b) reproduction in a different material form.

Appendix A

As an example, below is a volume map for an audio device demonstrating hysteresis. The hysteresis is evident by comparing the transition between the input level settings of 62 and 63. In the upper half of the volume map, the measured audio level changes from 4000 to 3000 going from 63 to 62. However, in the bottom half of the volume map, there is no change between 62 and 63.

```
int CRYSGNRL__MAPDATA[]=
    26000,    /*    @    Volume    Setting    100
    26000,    /*    @    Volume    Setting    99
    26000,    /*    @    Volume    Setting    98
    26000,    /*    @    Volume    Setting    97
    22000,    /*    @    Volume    Setting    96
    22000,    /*    @    Volume    Setting    95
    22000,    /*    @    Volume    Setting    94
    18000,    /*    @    Volume    Setting    93
    18000,    /*    @    Volume    Setting    92
    18000,    /*    @    Volume    Setting    91
    15000,    /*    @    Volume    Setting    90
    15000,    /*    @    Volume    Setting    89
    15000,    /*    @    Volume    Setting    88
    13000,    /*    @    Volume    Setting    87
    13000,    /*    @    Volume    Setting    86
    13000,    /*    @    Volume    Setting    85
    11000,    /*    @    Volume    Setting    84
    11000,    /*    @    Volume    Setting    83
    11000,    /*    @    Volume    Setting    82
     9000,    /*    @    Volume    Setting    81
     9000,    /*    @    Volume    Setting    80
     9000,    /*    @    Volume    Setting    79
     8000,    /*    @    Volume    Setting    78
     8000,    /*    @    Volume    Setting    77
     8000,    /*    @    Volume    Setting    76
     6000,    /*    @    Volume    Setting    75
     6000,    /*    @    Volume    Setting    74
     6000,    /*    @    Volume    Setting'   73
     6000,    /*    @    Volume    Setting    72
     5000,    /*    @    Volume    Setting    71
     5000,    /*    @    Volume    Setting    70
     5000,    /*    @    Volume    Setting    69
     4000,    /*    @    Volume    Setting    68
     4000,    /*    @    Volume    Setting    67
     4000,    /*    @    Volume    Setting    66
     4000,    /*    @    Volume    Setting    65
     4000,    /*    @    Volume    Setting    64
     4000,    /*    @    Volume    Setting    63
     3000,    /*    @    Volume    Setting    62
     3000,    /*    @    Volume    Setting    61
     3000,    /*    @    Volume    Setting    60
     2500,    /*    @    Volume    Setting    59
     2500,    /*    @    Volume    Setting    58
     2500,    /*    @    Volume    Setting    57
     2300,    /*    @    Volume    Setting    56
     2300,    /*    @    Volume    Setting    55
     2300,    /*    @    Volume    Setting    54
     1600,    /*    @    Volume    Setting    53
     1600,    /*    @    Volume    Setting    52
     1600,    /*    @    Volume    Setting    51
     1600,    /*    @    Volume    Setting    50
     1600,    /*    @    Volume    Setting    49
     1600,    /*    @    Volume    Setting    48
     1600,    /*    @    Volume    Setting    47
     1400,    /*    @    Volume    Setting    46
     1400,    /*    @    Volume    Setting    45
```

-continued

```
1400,   /*  @   Volume  Setting 44
1100,   /*  @   Volume  Setting 43
11.00,  /*  @   Volume  Setting 42
1100,   /*  @   Volume  Setting 41
900,    /*  @   Volume  Setting 40
900,    /*  @   Volume  Setting 39
900,    /*  @   Volume  Setting 38
900,    /*  @   Volume  Setting 37
900,    /*  @   Volume  Setting 36
900,    /*  @   Volume  Setting 35
700,    /*  @   Volume  Setting 34
700,    /*  @   Volume  Setting 33
700,    /*  @   Volume  Setting 32
500,    /*  @   Volume  Setting 31
500,    /*  @   Volume  Setting 30
500,    /*  @   Volume  Setting 29
500,    /*  @   Volume  Setting 28
500,    /*  @   Volume  Setting 27
500,    /*  @   Volume  Setting 26
400,    /*  @   Volume  Setting 25
400,    /*  @   Volume  Setting 24
400,    /*  @   Volume  Setting 23
400,    /*  @   Volume  Setting 22
300,    /*  @   Volume  Setting 21
300,    /*  @   Volume  Setting 20
300,    /*  @   Volume  Setting 19
300,    /*  @   Volume  Setting 18
300,    /*  @   Volume  Setting 17
300,    /*  @   Volume  Setting 16
200,    /*  @   Volume  Setting 15
200,    /*  @   Volume  Setting 14
200,    /*  @   Volume  Setting 13
200,    /*  @   Volume  Setting 12
200,    /*  @   Volume  Setting 11
200,    /*  @   Volume  Setting 10
100,    /*  @   Volume  Setting 9
100,    /*  @   Volume  Setting 8
100,    /*  @   Volume  Setting 7
100,    /*  @   Volume  Setting 6
100,    /*  @   Volume  Setting 5
100,    /*  @   Volume  Setting 4
100,    /*  @   Volume  Setting 3
100,    /*  @   Volume  Setting 2
100,    /*  @   Volume  Setting 1
100,    /*  @   Volume  Setting 0
100,    /*  @   Volume  Setting 1
100,    /*  @   Volume  Setting 2
100,    /*  @   Volume  Setting 3
100,    /*  @   Volume  Setting 4
100,    /*  @   Volume  Setting 5
100,    /*  @   Volume  Setting 6
100,    /*  @   Volume  Setting 7
100,    /*  @   Volume  Setting 8
100,    /*  @   Volume  Setting 9
100,    /*  @   Volume  Setting 10
200,    /*  @   Volume  Setting 11
200,    /*  @   Volume  Setting 12
200,    /*  @   Volume  Setting 13
200,    /*  @   Volume  Setting 14
200,    /*  @   Volume  Setting 15
200,    /*  @   Volume  Setting 16
300,    /*  @   Volume  Setting 17
300,    /*  @   Volume  Setting 18
300,    /*  @   Volume  Setting 19
300,    /*  @   Volume  Setting 20
300,    /*  @   Volume  Setting 21
400,    /*  @   Volume  Setting 22
400,    /*  @   Volume  Setting 23
400,    /*  @   Volume  Setting 24
400,    /*  @   Volume  Setting 25
400,    /*  @   Volume  Setting 26
400,    /*  @   Volume  Setting 27
400,    /*  @   Volume  Setting 28
500,    /*  @   Volume  Setting 29
500,    /*  @   Volume  Setting 30
500,    /*  @   Volume  Setting 31
600,    /*  @   Volume  Setting 32
600,    /*  @   Volume  Setting 33
600,    /*  @   Volume  Setting 34
```

-continued

```
800,    /*  @   Volume  Setting 35
800,    /*  @   Volume  Setting 36
800,    /*  @   Volume  Setting 37
900,    /*  @   Volume  Setting 38
900,    /*  @   Volume  Setting 39
900,    /*  @   Volume  Setting 40
1100,   /*  @   Volume  Setting 41
1100,   /*  @   Volume  Setting 42
1100,   /*  @   Volume  Setting 43
1300,   /*  @   Volume  Setting 44
1300,   /*  @   Volume  Setting 45
1300,   /*  @   Volume  Setting 46
1600,   /*  @   Volume  Setting' 47
1600,   /*  @   Volume  Setting 48
1600,   /*  @   Volume  Setting 49
1600,   /*  @   Volume  Setting 50
1900,   /*  @   Volume  Setting 51
1900,   /*  @   Volume  Setting 52
1900,   /*  @   Volume  Setting 53
2200,   /*  @   Volume  Setting 54
2200,   /*  @   Volume  Setting 55
2200,   /*  @   Volume  Setting 56
2600,   /*  @   Volume  Setting 57
2600,   /*  @   Volume  Setting 58
2600,   /*  @   Volume  Setting 59
3000,   /*  @   Volume  Setting 60
3000,   /*  @   Volume  Setting 61
3000,   /*  @   Volume  Setting 62
3000,   /*  @   Volume  Setting 63
4000,   /*  @   Volume  Setting 64
4000,   /*  @   Volume  Setting 65
4000,   /*  @   Volume  Setting 66
4000,   /*  @   Volume  Setting 67
4000,   /*  @   Volume  Setting 68
5000,   /*  @   Volume  Setting 69
5000,   /*  @   Volume  Setting 70
5000,   /*  @   Volume  Setting 71
6000,   /*  @   Volume  Setting 72
6000,   /*  @   Volume  Setting 73
6000,   /*  @   Volume  Setting 74
6000,   /*  @   Volume  Setting 75
7000,   /*  @   Volume  Setting 76
7000,   /*  @   Volume  Setting 77
7000,   /*  @   Volume  Setting 78
9000,   /*  @   Volume  Setting 79
9000,   /*  @   Volume  Setting 80
9000,   /*  @   Volume  Setting 81
10000,  /*  @   Volume  Setting 82
10000,  /*  @   Volume  Setting 83
10000,  /*  @   Volume  Setting 84
12000,  /*  @   Volume  Setting 85
12000,  /*  @   Volume  Setting 86
12000,  /*  @   Volume  Setting 87
15000,  /*  @   Volume  Setting 88
15000,  /*  @   Volume  Setting 89
15000,  /*  @   Volume  Setting 90
18000,  /*  @   Volume  Setting 91
18000,  /*  @   Volume  Setting 92
18000,  /*  @   Volume  Setting 93
20000,  /*  @   Volume  Setting 94
20000,  /*  @   Volume  Setting 95
20000,  /*  @   Volume  Setting 96
25000,  /*  @   Volume  Setting 97
25000,  /*  @   Volume  Setting 98
25000,  /*  @   Volume  Setting 99
25000,  /*  @   Volume  Setting 100
```

APPENDIX B

```
const VOLUMEMAP CRYSGNRL=
{
    'G', 'C', '1', '0',     /* signature and version
    0x4A,                   /* flags */
    'C', 'R', 'Y', '5',     /* CODEC ID
    'G', 'N', 'R', 'L',     /* microphone ID
    16,                     /* bits per sample
    1,                      /* channels
    100,                    /* maximum Volume Setting
    0,                      /* minimum Volume Setting
```

-continued

```
    1,                      /* step size */
    201,                    /* count of values
    602L,                   /* user supplied hysteresis value
    &CRYSGNRL_MAPDATA[0]    /* Volume Map data array
};
```

We claim:

1. An automatic gain control method comprising:
    providing an audio signal to an audio device having a range of permissible signal level settings and a signal level controller for establishing a particular signal level setting;
    measuring an actual signal level for said audio signal at an established signal level setting and storing said measured actual signal level and corresponding established signal level setting in a volume map;
    establishing a different signal level setting using said signal level controller, re-measuring said actual signal level and storing said re-measured actual signal level and corresponding established different signal level setting in said volume map; and,
    using said volume map during an audio processing session to determine a signal level setting for said audio device, said signal level setting corresponding to a desired actual audio signal level, wherein said audio processing session is a speech recognition session.

2. The automatic gain control method of claim 1, further comprising:
    repeating said step of establishing a different input signal level setting using said input signal level controller, re-measuring said actual signal level and storing said re-measured actual signal level and corresponding input signal level setting in said volume map for each permissible input signal level setting.

3. The automatic gain control method of claim 1, wherein said audio signal is an audio input signal.

4. The automatic gain control method of claim 1, wherein said audio signal is an audio output signal.

5. The automatic gain control method of claim 2, wherein said audio processing session is a speech recognition session.

6. The automatic gain control method of claim 2, further comprising:
    detecting a hysteresis condition in said volume map.

7. The automatic gain control method of claim 1, wherein said providing step comprises:
    providing an audio signal of known frequency and constant signal level to said audio device.

8. The automatic gain control method of claim 1, wherein said measuring step comprises:
    measuring an actual signal level for said audio signal at a first permissible signal level setting in said range and storing said measured actual signal level and corresponding first permissible signal level setting in said volume map.

9. The automatic gain control method of claim 8, wherein said step of establishing a different signal level setting using said signal level controller, re-measuring said actual signal level and storing said re-measured actual signal level and corresponding established different signal level setting in said volume map comprises:
    incrementally adjusting upward said signal level setting using said signal level controller, re-measuring said actual signal level and storing said re-measured actual signal level and corresponding incrementally adjusted signal level setting in said volume map.

10. The automatic gain control method of claim 2, wherein said measuring step comprises:
    measuring an actual signal level for said audio signal a first permissible signal level in said range and storing said measured actual signal level and corresponding first permissible signal level setting in said volume map.

11. The automatic gain control method of claim 10, wherein said step of establishing a different signal level setting using said signal level controller, re-measuring said actual signal level and storing said re-measured actual signal level and corresponding established different signal level setting in said volume map comprises:
    incrementally adjusting upward said signal level setting using said signal level controller, re-measuring said actual signal level and storing said re-measured actual signal level and corresponding incrementally adjusted signal level setting in said volume map.

12. The automatic gain control method comprising:
    providing an audio signal to an audio device having a range of permissible signal level settings and a signal level controller for establishing a particular signal level setting;
    measuring an actual signal level for said audio signal at an established signal level setting and storing said measured actual signal level and corresponding established signal level setting in a volume map;
    establishing a different signal level setting using said signal level controller, re-measuring said actual signal level and storing said re-measured actual signal level and corresponding established different signal level setting in said volume map; and,
    using said volume map during an audio processing session to determine a signal level setting for said audio device, said signal level setting corresponding to a desired actual audio signal level, wherein said steps of measuring and re-measuring said actual signal level comprise measuring and re-measuring an average peak amplitude for said audio signal.

13. An automatic gain control method comprising:
    providing an audio signal to an audio device having a range of permissible signal level settings and a signal level controller for establishing a particular signal level setting;
    measuring an actual signal level for said audio signal at an established signal level setting and storing said measured actual signal level and corresponding established signal level setting in a volume map;
    establishing a different signal level setting using said signal level controller, re-measuring said actual signal level and storing said re-measured actual signal level and corresponding established different signal level setting in said volume map;
    repeating said step of establishing a different signal level setting using said input signal level controller, re-measuring said actual signal level and storing said re-measured actual signal level and corresponding input signal level setting in said volume map for each permissible input signal level setting; and
    using said volume map during an audio processing session to determine a signal level setting for said audio device, said signal level setting corresponding to a desired actual audio signal level, wherein said using step comprises:
   determining established signal level settings in said volume map at which a threshold change occurs in said corresponding actual signal level; and,
   adjusting said actual audio signal level according to said determined signal level settings.

14. The automatic gain control method of claim 13, wherein said determining stop comprises:
   computing an average of successive actual signal level values in said volume map;
   comparing each successive actual signal level value to said computed average; and,
   if a compared actual signal level value differs from said computed average by more than a pre-determined value, identifying a corresponding established signal level setting as a signal level setting at which an incremental change occurs, and resetting said average.

15. An audio device characterization method comprising:
   providing an audio signal to an audio device having a range of permissible signal level settings and a signal level controller for establishing a particular signal level setting;
   measuring an actual signal level for said audio signal at an established signal level setting and storing said measured actual signal level and corresponding established signal level setting in a table;
   establishing a different signal level setting using said signal level controller, re-measuring said actual signal level and storing said re-measured actual signal level and corresponding established different signal level setting in said table;
   repeating said step of establishing a different input signal level setting using said input signal level controller, re-measuring said actual signal level and storing said re-measured actual signal level and corresponding input signal level setting in said table for each permissible input signal level setting;
   comparing successive actual signal level measurements in said table, said comparisons identifying threshold changes in actual signal levels responsive to changes in corresponding input signal level settings; and,
   for each identified threshold change in actual signal level, storing said changed actual signal level and corresponding input level setting in a volume map.

16. The audio device characterization method of claim 15, wherein said measuring step comprises:
   measuring an actual signal level for said audio signal at a first permissible signal level setting in said range and storing said measured actual signal level and corresponding first permissible signal level setting in said table.

17. The audio device characterization method of claim 16, wherein said step of establishing a different signal level netting using said signal level controller, re-measuring said actual signal level and storing said re-measured actual signal level and corresponding established different signal level setting in said table comprises:
   incrementally adjusting upward said signal level setting using said signal level controller, re-measuring said actual signal level and storing said re-measured actual signal level mid corresponding incrementally adjusted signal level setting in said table.

18. The audio device characterization method of claim 15, further comprising:
   distributing said volume map for use with said audio device.

19. A machine readable storage, having stored thereon a computer program for characterizing an audio device, said computer program having a plurality of code sections executable by a machine for causing the machine to perform the steps of:
   providing an audio signal to an audio device having a range of permissible signal level settings and a signal level controller for establishing a particular signal level setting;
   measuring an actual signal level for said audio signal at an established signal level setting and storing said measured actual signal level and corresponding established signal level setting in a table;
   establishing a different signal level setting using said signal level controller, re-measuring said actual signal level and storing said re-measured actual signal level and corresponding established different signal level setting in said table;
   repeating said step of establishing a different input signal level setting using said input signal level controller, re-measuring said actual signal level and storing said re-measured actual signal level and corresponding input signal level setting in said table for each permissible input signal level setting;
   comparing successive actual signal level measurement in said table, said comparisons identifying threshold changes in actual signal levels responsive to changes in corresponding input signal level settings; and,
   for each identified threshold change in actual signal level, storing said changed actual signal level and corresponding input level setting in a volume map.

20. The machine readable storage of claim 19, wherein said measuring step comprises:
   measuring an actual signal level for said audio signal at a first permissible signal level setting in said range and storing said measured actual signal level and corresponding first permissible signal level setting in said table.

21. The machine readable storage of claim 20, wherein said step of establishing a different signal level setting using said signal level controller, re-measuring said actual signal level and storing said re-measured actual signal level and corresponding established different signal level setting in said table comprises:
   incrementally adjusting upward said signal level setting using said signal level controller, re-measuring said actual signal level and storing said re-measured actual signal level and corresponding incrementally adjusted signal level setting in said table.

22. The machine readable storage of claim 19, further comprising:
   distributing said volume map for use with said audio device.

* * * * *